United States Patent [19]

Uwabo et al.

[11] Patent Number: 5,583,745
[45] Date of Patent: Dec. 10, 1996

[54] DATA RECORDING AND REPRODUCING DEVICE COMPRISING A MEMORY UNIT USED FOR A MEMORY CARD

[75] Inventors: Tsuneo Uwabo; Yoshihiro Okano; Eiichi Yoneyama; Yoshinori Tangi, all of Atsugi, Japan

[73] Assignee: Mitsumi Electric Co., Ltd., Tokyo, Japan

[21] Appl. No.: 406,667

[22] Filed: Mar. 20, 1995

[30] Foreign Application Priority Data

Sep. 8, 1994 [JP] Japan .................. 6-214953

[51] Int. Cl.$^6$ .................. H05K 7/10; G06F 1/16
[52] U.S. Cl. .................. 361/685; 361/684; 439/159
[58] Field of Search .................. 361/684, 685, 361/686, 679, 683, 724–727, 729–733, 735, 742, 754, 758, 770, 790, 796, 797, 798; 439/79, 80, 159; 364/708.1

[56] References Cited

U.S. PATENT DOCUMENTS

| | | |
|---|---|---|
| 4,418,972 | 12/1983 | Benasutti .................. 339/14 R |
| 5,163,835 | 11/1992 | Morlion et al. .................. 439/79 |
| 5,299,089 | 3/1994 | Lwee .................. 361/684 |
| 5,324,204 | 6/1994 | Lwee .................. 361/684 |
| 5,472,349 | 12/1995 | Dixon et al. .................. 439/79 |
| 5,483,419 | 1/1996 | Kaczeus, Sr. et al. .................. 361/685 |

Primary Examiner—Leo P. Picard
Assistant Examiner—Lynn D. Feild
Attorney, Agent, or Firm—Frishauf, Holtz, Goodman, Langer & Chick

[57] ABSTRACT

A data recording and reproducing device comprises a first memory unit which is selected from an FDD unit and an HDD unit, and a second memory unit used for a memory card which is standardized in PCMCIA. The first and the second memory units are superposed each other so as to have a height less than one inch. The device further comprises a cover plate containing the first and the second memory units and having shield function against external noise.

5 Claims, 5 Drawing Sheets

5,583,745

DATA RECORDING AND REPRODUCING DEVICE COMPRISING A MEMORY UNIT USED FOR A MEMORY CARD

BACKGROUND OF THE INVENTION

This invention relates to a data recording and reproducing device comprising a memory unit for a memory card.

Heretofore, a data processing device having such a scale as a personal computer comprises a main body containing a CPU (Central Processing Unit) as a host unit, a display unit mounted on the main body, and a keyboard for data input. Generally, two memory units such as a flexible disk drive unit (hereinafter abbreviated to an FDD unit) and a hard disk drive unit (hereinafter abbreviated to an HDD unit) are individually assembled into the main body.

In the meanwhile, in recent years, a memory card is provided for memorizing personal information, such as medical information. As an example of the memory card, a memory card standardized in PCMCIA (Personal Computer Memory Card International Association) is well known. Such memory card can be used in the same manner as other IC memory cards which are well known. For example, the memory card is combined with a memory unit for the use of the memory card only. The memory unit is assembled into the data processing device described above. In this case, it is possible to carry out data recording and data reproducing to the memory card by the data processing device. As a result, the memory card is improved in flexibility.

However, like the FDD unit and the HDD unit, the memory unit for the memory card is formed as a single unit which is standardized in size. In addition, it is required that those units are individually assembled into the main body of the data processing device. For example, when the FDD unit for the flexible disk of 3.5 inches and the memory unit for the memory card are assembled into the main body of the data processing device, a total height of the FDD unit and the memory unit is generally over 40 mm. As a result, it is difficult to assemble the FDD unit and the memory unit into the data processing device which is reduced in size.

In addition, the memory unit tends to receive external noise, such as magnetic noise, on access to the memory card. Accordingly, it is required that the memory unit must be shielded from the external noise.

SUMMARY OF THE INVENTION

It is therefore an object of this invention to provide a data recording and reproducing device which can integrate an FDD unit or an HDD unit and a memory unit for a memory card into a single unit by a reduced height.

It is another object of this invention to provide the data recording and reproducing device which can shield the memory unit from external noise by a simple structure.

Other objects of this invention will become clear as the description proceeds.

This invention is applied to a data recording and reproducing device comprising a first memory unit which is selected from an FDD unit and an HDD unit, and a second memory unit used for a memory card which is standardized in PCMCIA.

According to an aspect of this invention, the first and the second memory units are integrated and superposed each other so as to have a total height less than one inch. The device further comprises a cover plate containing the first and the second memory units and having shield function against external noise.

DESCRIPTION OF THE PREFERRED EMBODIMENTS

Figure 1:
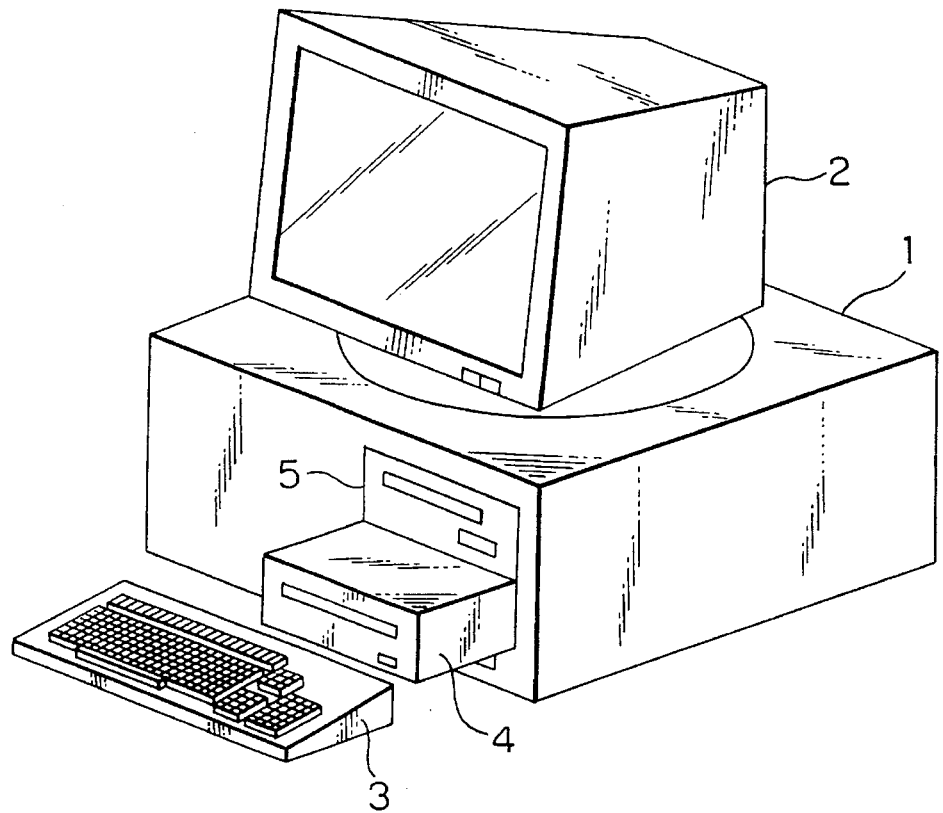
FIG. 1 is a perspective view for describing a conventional data processing device.

Referring to FIG. 1, a conventional data processing device will be described at first for a better understanding of this invention. The data processing device has such a scale as a personal computer. The data processing device comprises a main body 1 containing a CPU (Central Processing Unit) as a host unit, a display unit 2 mounted on the main body 1, and a keyboard 3 for data input. Generally, two memory units 4 and 5, such as an FDD (Flexible Disk Drive) unit, an HDD (Hard Disk Drive) unit, and a card memory unit for a memory card, are individually assembled into the main body 1. For convenience, the memory unit 4 is illustrated as a state of pulling it out from the main body 1. Such a memory unit may be called a slot. Each of the memory units 4 and 5 is formed as a single unit. It is supposed that the memory unit 4 is the FDD unit for a flexible disk of 3.5 inches while the memory unit 5 is the card memory unit for the memory card. When the memory units 4 and 5 are assembled into the main body 1, a total height of the memory units 4 and 5 is generally over 40 mm. This means that it is difficult to assemble both the memory units 4 and 5 into the main body 1 which is reduced in size.

In addition, when access operation is carried out to the memory card, the memory unit tends to receive external noise, such as magnetic noise. In this case, the memory unit should be shielded from the external noise.

Figure 2:
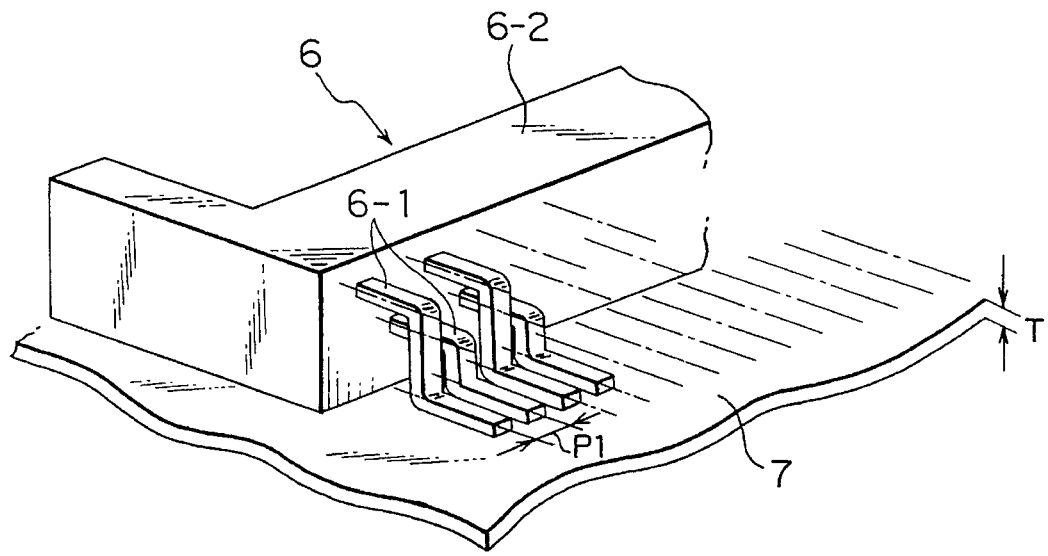
FIG. 2 is a perspective view illustrating a part of a conventional connecting unit for a memory card.

Referring to FIG. 2, description will be made as regards a conventional connecting unit which is provided for the memory unit 5 in order to connect the memory unit 5 and the CPU of the data processing unit. As will later be described, the memory card comprises a plurality of receptacles for data input and output. The connecting unit comprises a connector 6 comprising a plurality of pin terminals 6-1. The plurality of pin terminals 6-1 are for connecting between the plurality of receptacles of the memory card and a plurality of wiring patterns (not shown), respectively, formed on a printed circuit board 7 having a thickness of T. The plurality of pin terminals 6-1 are attached to an insulator 6-2 mounted on the printed circuit board 7 so as to penetrate the insulator 6-2. The plurality of pin terminals 6-1 are divided into upper and lower groups. As apparent from FIG. 2, one end of each of the pin terminals 6-1 of the upper and the lower groups is bent so that an end portion thereof is brought into contact with the printed circuit board 7. Although other ends of the pin terminals 6-1 are not shown, the other ends extend parallel with a surface of the printed circuit board 7 so that the plurality of receptacles can receive the other ends of the pin terminals 6-1.

With regard to the one ends of the pin terminals 6-1, it is required that the one ends must be bent and arranged parallel with one another on the printed circuit board 7 at a predetermined interval P1. It should be noted here that each of the pin terminals 6-1 of the lower group is arranged between two adjacent pin terminals of the upper group. This means that the predetermined interval P1 becomes small. This fact causes difficulty of work for connecting the pin terminals 6-1 to the wiring patterns of the printed circuit board 7. In addition to the difficulty of work, the memory unit 5 has an increased height increased by the thickness T because the insulator 6-2 is mounted on the printed circuit board 7.

Figure 3:
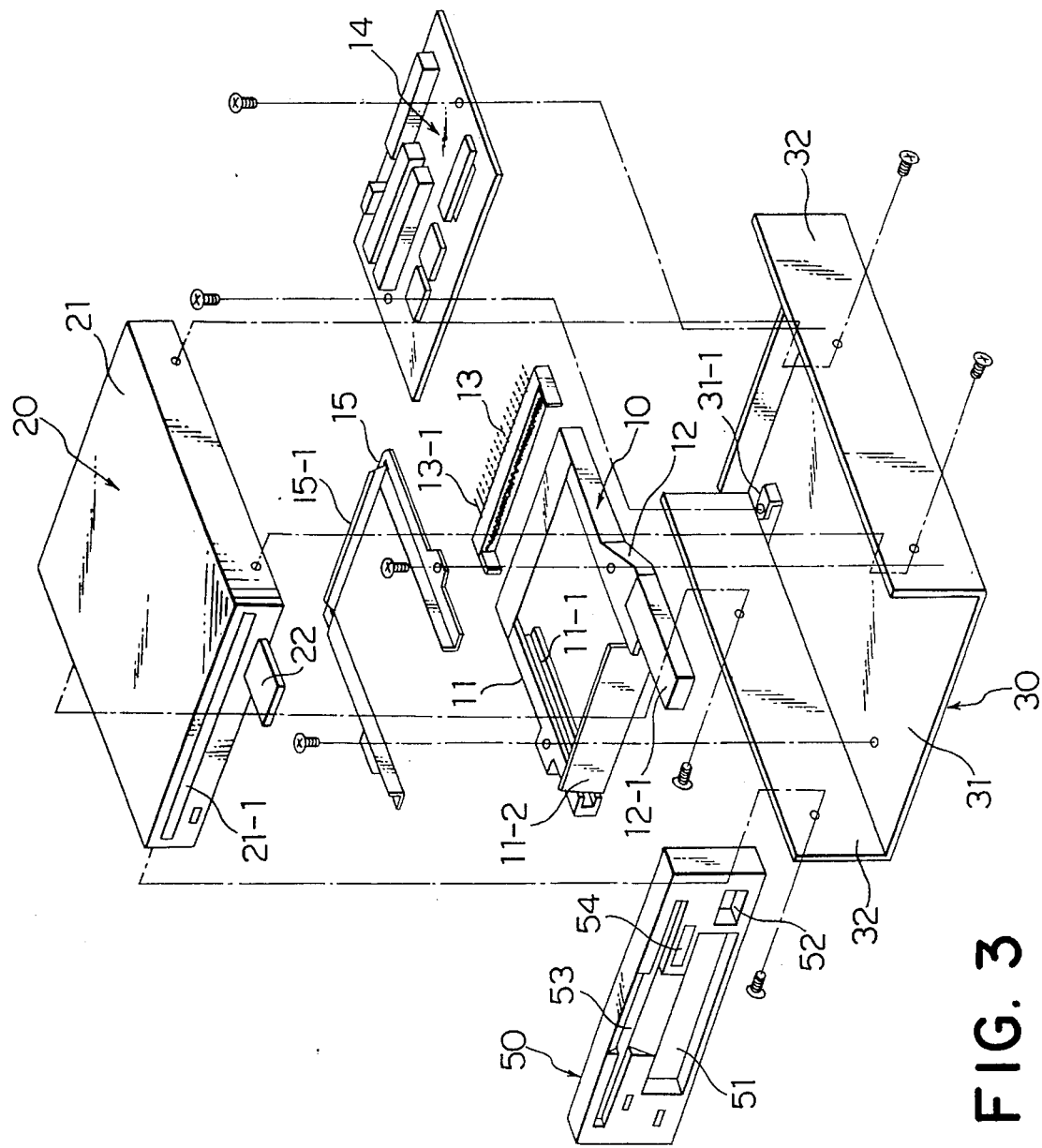
FIG. 3 is an exploded perspective view of a data recording and reproducing device according to a first embodiment of this invention.
Figure 4:
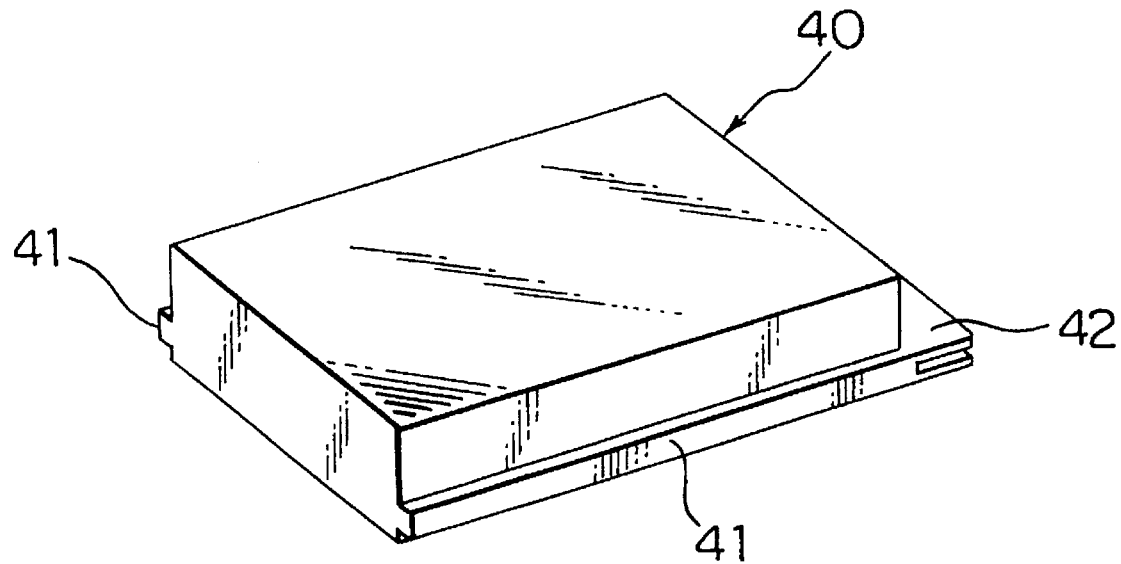
FIG. 4 is a perspective view for describing a memory card used for the data recording and reproducing device illustrated in FIG. 3.
Figure 5:
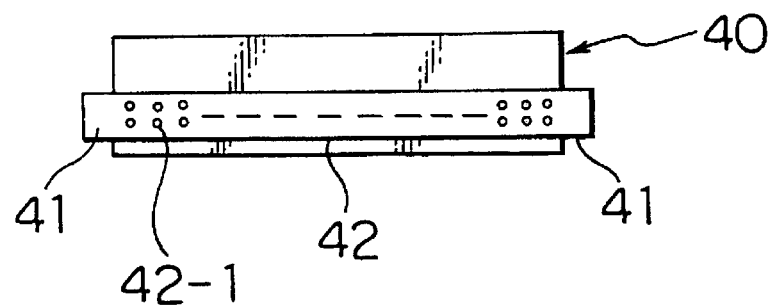
FIG. 5 is a side view of the memory card illustrated in FIG. 4.

Referring to FIGS. 3 to 5, the description will be made as regards a first embodiment of a data recording and reproducing device according to this invention. In FIG. 3, the data recording and reproducing device comprises a card memory unit 10 used for a memory card (not shown) which is standardized in PCMCIA and an FDD unit 20. The card memory unit 10 and the FDD unit 20 are superposed each other so as to integrally assemble in a cover plate 30 which is made of metal.

In FIGS. 4 and 5, a memory card 40 is a rectangle and is provided in various types, such as an IC memory device, an HDD memory device of a card type, an MODEM unit used for a facsimile, or so on. At any rate, the memory card 40 comprises a memory embedded therein. The memory card 40 further comprises a pair of flanges 41 formed on its both side ends and a connector 42 formed on its one end for electrically connecting the memory to the CPU through a connector 13 illustrated in FIG. 3. The connector 42 comprises a plurality of receptacles 42-1 buried therein. As well known in the art, each of the plurality of receptacles 42-1 is a cylindrical conductor for receiving a pin terminal mentioned in conjunction with FIG. 2.

Turning back to FIG. 3, the card memory unit 10 comprises a hold frame 11 for holding the memory card 40 illustrated in FIGS. 4 and 5, an ejecting mechanism 12 for ejecting the memory card 40 out of the card memory unit 10, the connector 13 for electrically connecting between the memory card 40 and the CPU, a printed circuit board 14 comprising connectors, electric devices for signal processing, and so on.

The hold frame 11 is used for guiding the memory card 40 on insertion of the memory card 40 and holding the memory card 40 inserted into the card memory unit 10. For this purpose, the hold frame 11 has a pair of groove portions 11-1 formed on a pair of inside surfaces of the hold frame 11, which extend in parallel to each other. The pair of groove portions 11-1 are for receiving the pair of flanges 41 of the memory card 40 illustrated in FIGS. 4 and 5. A shutter blade 11-2 is rotatably attached to one end portion of the hold frame 11. The shutter blade 11-2 can rotate towards inside of the hold frame 11 on pushing by the memory card 40 to be inserted into the card memory unit 10. The shutter blade 11-2 is combined with a Spring mechanism (not shown) for turning the shutter blade 11-2 back to the former position illustrated in FIG. 3 when the memory card 40 is ejected from the card memory unit 10.

The hold frame 11 is further combined with the ejecting mechanism 12 for ejecting the memory card 40 held in the hold frame 11. The ejecting mechanism 12 effects so as to eject the memory card 40 on push of an ejecting button 12-1. As the ejecting mechanism 12 is well known in the art, illustration and description for inside structure of the ejecting mechanism 12 will be omitted. The Connector 13 is attached to another end portion of the hold frame 11, namely, other end portion corresponding to the connector 42 of the memory card 40 (FIG. 5) held in the hold frame 11. The connector 13 comprises a plurality of pin terminals 13-1. One ends of the plurality of pin terminals 13-1 are inserted into the plurality of receptacles 42-1 of the connector 42 when the memory card 40 is inserted into the card memory unit 10. Other ends of the plurality of pin terminals 13-1 will be mentioned later.

The hold frame 11 and a spacer 15 (to be described later) are superposed each other and are attached to a main plate 31 of the cover plate 30 by means of a plurality of screws screwed into the main plate 31. The Connector 13 is fixedly attached, for example, to the hold frame 11 by the use of screws (not shown). The printed circuit board 14 is also attached to the main plate 31 by means of a plurality of screws screwed into the main plate 31. The, the printed circuit board 14 is attached to a pair of attachment portions 31-1 formed by cutting a part of the main plate 31 as a cut out portion and then bending the cut out portions into L-shape. As a result, the printed circuit board 14 is spaced apart from the main plate 31 by a short distance which is equal to a height of the attachment portions 31-1. The reason why the printed circuit board 14 is spaced apart from the main plate 31 will be mentioned later.

The cover plate 30 comprises side plates 32 opposite to each Other. The FDD unit 20 is attached between the side plates 32 after the card memory unit 10 and the spacer 15 are attached to the main plate 31. Thus, the FDD unit 20 is attached to the cover plate 30 so as to sandwich the card memory unit 10 between the main plate 31 and the FDD unit 20. This means that the card memory unit 10 is shielded from external noise by the cover plate 30 and the FDD unit 20.

Inasmuch as the FDD unit 20 is well known in the art, illustration and description of the internal structure thereof will be omitted. A case 21 of the FDD unit 20 is made of metal and has a front portion provided with an opening 21-1 for insertion and ejection of a flexible disk (not shown). An eject button 22 is protruded from the front portion of the case 21 and is combined with an ejecting mechanism (not shown) which is for ejecting the flexible disk inserted into the FDD unit 20.

The front portions of the card memory unit 10 and the FDD unit 20 are made to be flush or coplanar with each other and are covered by a front panel 50. The front panel 50 is fixed, for example, to the side plates 32 by the use of screws (not shown). The front panel 50 has a first slit 51 for allowing insertion and ejection of the memory card 40 and a first aperture 52 through which the eject button 12-1 protrudes. The first slit 51 and the first aperture 52 correspond, in position, to the shutter blade 11-2 and the eject button 12-1, respectively. The front panel 50 further has a second slit 53 for allowing insertion and ejection of the flexible disk and a second aperture 54 to which the eject button 22 protrudes. The second slit 53 and the second aperture 54 correspond, in position, to the opening 21-1 of the case 21 and the eject button 22, respectively.

In the meanwhile, it is necessary to provide a little space between the card memory unit 10 and the FDD unit 20. This is because a part of the memory card 40 may protrude upwardly from the hold frame 11 in a case that the memory card 40 has a thickness, for example, of about several millimeters or more. In other words, the memory card 40 has a protruded portion upwardly protruded from the hold frame 11. In this case, a height of the space between the card memory unit 10 and the FDD unit 20 must be larger than that of the protruded portion of the memory card 40. However, the following problems may occur when the little space is provided between the card memory unit 10 and the FDD unit 20. Namely, there is a case that foreign matter, such as a coin, is inserted into the card memory unit 10 via the first slit 51. In this event, the foreign matter may enter a space on the printed circuit board 14 via the little space. The foreign matter may cause a short circuit on the printed circuit board 14.

As mentioned above, the spacer 15 made from metal material is attached onto the hold frame 11. The spacer 15 comprises a bent portion 15-1 upwardly bent therefrom in order to certainly stop up the rear space between the card memory unit 10 and the FDD unit 20. Inasmuch as the spacer 15 is made from metal material, the spacer 15 has a shielding function for shielding the memory card unit 10 from external noise from the rear of the device.

Figure 6:
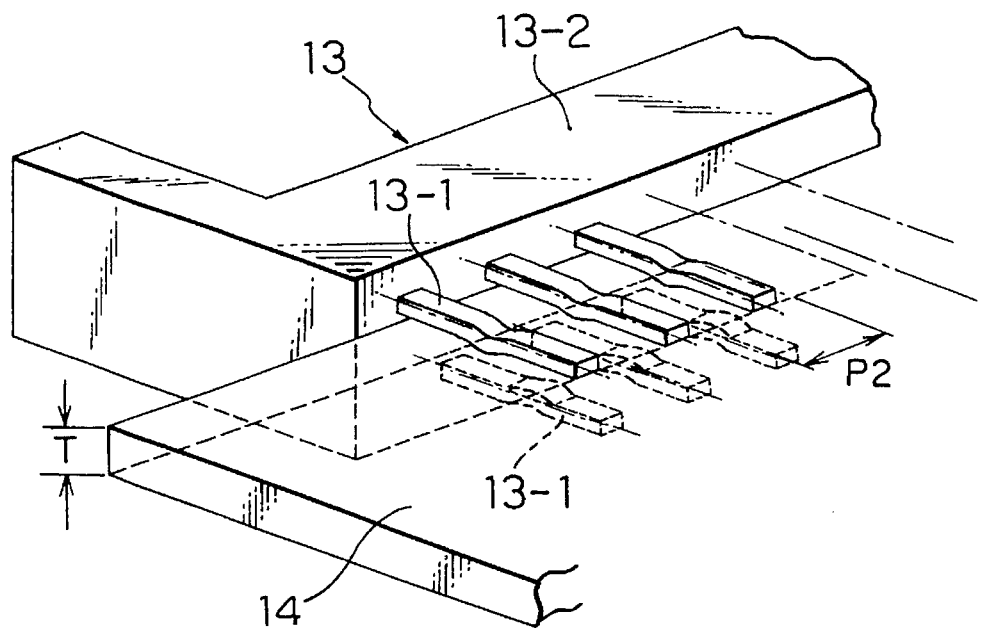
FIG. 6 is a perspective view illustrating a part of a connecting unit which is applied to this invention.

Referring to FIG. 6, the connector 13 comprises the plurality of pin terminals 13-1 for connecting the plurality of receptacles 42-1 of the memory card 40 to the CPU. The plurality of pin terminals 13-1 penetrate an insulator 13-2 and are divided into upper and lower side groups which are arranged parallel to each other. The insulator 13-2 is mounted on the main plate (FIG. 3). Although one ends of the plurality of pin terminals 13-1 are not shown, those ends are protruded from an inner side surface of the insulator 13-2 so as to extend parallel with the main plate 31 of the cover plate 30. Similarly, other ends of the plurality of pin terminals 13-1 are protruded from an outer side surface of the insulator 13-2 so as to be parallel with the main plate 31. The printed circuit board 14 is attached to the main plate 31 in a state that it is sandwiched between the upper and the lower side groups of the plurality of pin terminals 13-1. This is the reason why the printed circuit board 14 is spaced apart from the main plate 31. The printed circuit board 14 has a plurality of wiring patterns (not shown) formed on upper and under surfaces thereof. The pin terminals 13-1 of the upper and the lower side groups are connected by soldering to the wiring patterns of the upper and the under surfaces of the printed circuit board 14.

It should be noted here that an interval P2 between two adjacent pin terminals 13-1 is twice as long as the predetermined interval P1 of the connector 6 illustrated in FIG. 2. This fact brings more facility of work for connecting the plurality of pin terminals 13-1 to the wiring patterns of the printed circuit board 14. Bonding strength between the connector 13 and the printed circuit board 14 increases because the plurality of pin terminals 13-1 are connected by soldering to both the upper and the under surfaces of the printed circuit board 14. Note that the printed circuit board 14 is attached to an under surface of the connector 13 as shown in FIG. 2, but that the printed circuit board 14 is spaced apart from the surface of the printed circuit board 14. This means that it is possible to reduce a thickness of the card memory unit 10 by the thickness T of the printed circuit board 14. Namely, it is possible to reduce in height of the data recording and reproducing device by the thickness T.

Concretely, the data recording and reproducing device according to this invention has the same size as the conventional FDD unit for 3.5 inches. For example, the size of the data recording and reproducing device is equal to 25.4 mm in height and is equal to 101.6 mm in width. A depth of the data recording and reproducing device can be voluntarily determined. As a result, the data recording and reproducing device according to this invention has interchangeability and can be used in place of the conventional FDD unit for 3.5 inches used for a conventional data processing device. In other words, it is possible to assemble both of the card memory unit 10 and the FDD unit 20 into a space for the conventional FDD unit for 3.5 inches.

Figure 7:
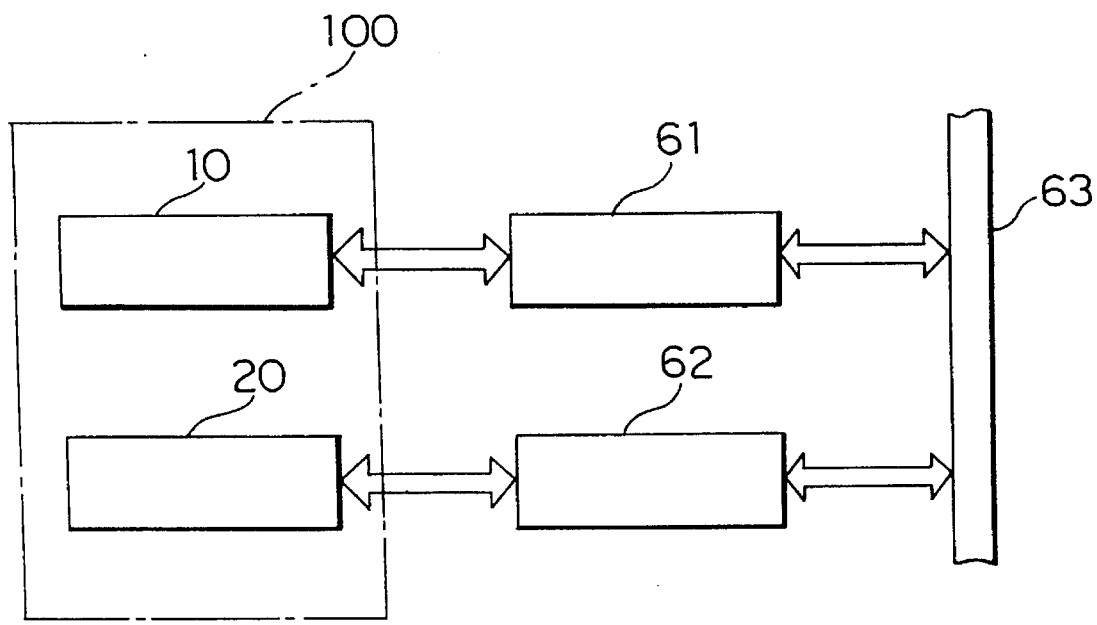
FIG. 7 is a block diagram for describing connection between the data recording and reproducing device and a data processing device which is applied to this invention.

In the meanwhile, the card memory unit 10 and the FDD unit 20 produce output signals which have different formats. In order to connect each of the card memory unit 10 and the FDD unit 20 to the CPU in the main body of the data processing device depicted at 100, it is required that the card memory unit 10 and the FDD unit 20 have an interface unit as shown in FIG. 7. In FIG. 7, the card memory unit 10 and the FDD unit 20 are connected to a bus line 63 through a first interface unit 61 for the card memory unit 10 and a second interface unit 62 for the FDD unit 20, respectively. The first and the second interface units 61 and 62 are well known in the art.

Figure 8:
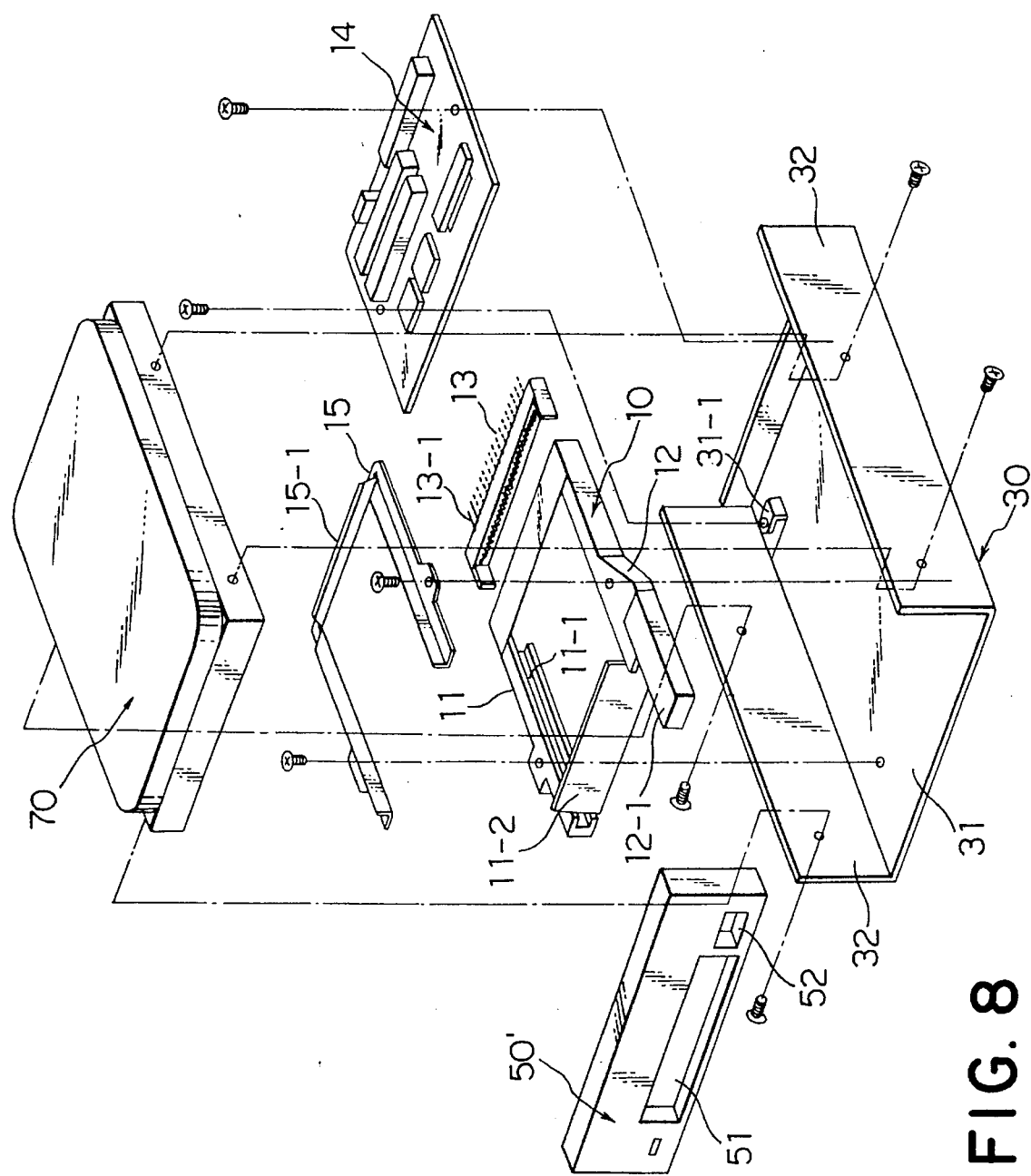
FIG. 8 is an exploded perspective view of a data recording and reproducing device according to a second embodiment of this invention.

Referring to FIG. 8, the description will be directed to a second embodiment of this invention. In this embodiment, a data recording and reproducing device comprises a combination of the card memory unit 10 and an HDD unit 70 used in place of the FDD unit 20 illustrated in FIG. 3. As known in the art, the HDD unit 70 contains a hard disk (not shown) in a sealing condition. Therefore, it is enough that a front panel 50'has a first slit 51 for allowing insertion and ejection of the memory card 40 (shown in FIGS. 4 and 5) and a first aperture 52 for protruding the eject button 12-1. Other portions of the data recording and reproducing device in the second embodiment will not be described because those portions are the same with those of the first embodiment illustrated in FIG. 3.

Although this invention has thus far been described in conjunction with two embodiments, this invention is not restricted to the two embodiments described above and is able to modify in various manners. For example, the cover plate 30 or the spacer 15 is not restricted to the material, such as metal. For example, it may be made from resin mixed with magnetic shielding material against magnetic noise. The shutter blade 11-2 in the card memory unit 10 may be omitted. Although the data recording and reproducing device of this invention is set in a horizontal style as illustrated in FIG. 3, the device may be set in a vertical style so that the side plate 32 serves as an under surface.

According to this invention, the card memory unit and the other memory unit are integrally assembled into a single body which has the same size as that of the conventional FDD unit for 3.5 inches. Thus, the data recording and reproducing device can be assembled into a data processing device having a small size. In addition, the data recording and reproducing device can be used in place of the conventional FDD unit for 3.5 inches used for the conventional data processing device.

Inasmuch as the card memory unit is sandwiched between the other memory unit and the cover plate, the card memory unit can be shielded from the external noise without a special shield member.

It is possible to stop a space or a gap formed between the card memory unit and the other memory unit by the use of the spacer having shield function. As a result, it is possible to prevent the case that the foreign matter enters the space containing the printed circuit board in the device and to improve the shield function for the card memory unit against the external noise.

Since it is possible to improve electrical connection between the connector of the card memory unit and the printed circuit board, the card memory unit can be reduced in thickness, namely, a height size. As a result, it is possible to reduce the thickness of the data recording and reproducing device.

What is claimed is:

1. A data recording and reproducing device comprising:

a first memory unit which is selected from a flexible disk drive unit used for a flexible disk medium and a hard disk drive unit containing a hard disk medium, said flexible disk medium being insertable in said flexible disk drive unit and ejectable from said flexible disk drive unit; and a second memory unit used for a memory card which is insertable in said second memory unit and ejectable from said second memory unit;

said first and said second memory units being superposed on each other with a vertical spacing therebetween and so as to have a total height of less than one inch;

a cover plate for covering at least side portions of said superposed first and said second memory units, and said cover plate having a shielding function for shielding said superposed first and second memory units against an external force;

a spacer for covering at least the side and rear portions of said space between said first and second memory units; and wherein said cover plate and said spacer are made of a material such that said cover plate and said spacer have a shielding function for shielding said superposed first and second memory units against external noise.

2. A data recording and reproducing device as claimed in claim 1, wherein:

said second memory unit comprises a hold frame for holding said memory card at side ends of said memory card inserted therein; and said spacer is made from metal material and comprises upwardly bent portions which extend between said superposed first and second memory units to block said space between said first and second memory units.

3. A data recording and reproducing device as claimed in claim 1, wherein:

said cover plate is made from metal material and comprises a main plate portion and side plate portions, said side plate portions being at respective opposite side ends of said main plate portion, and said side plate portions being arranged to face each other;

said second memory unit is mounted on said main plate portion; and said first memory unit is attached to said side plate portion so as to cover said second memory unit.

4. A data recording and reproducing device as claimed in claim 3, wherein:

said first memory unit is a flexible disk drive unit;

said device further comprises a front panel fitted to front surfaces of said first and second memory units; and said front panel has first and second slits therein for inserting said flexible disk medium and said memory card into said first and said second memory units, respectively, and first and second apertures for protruding first and second eject buttons which are for ejecting said flexible disk medium and said memory card from said first and said second memory units, respectively.

5. A data recording and reproducing device as claimed in claim 1, wherein:

said memory card comprises a plurality of receptacles attached to a front end portion thereof;

said second memory unit comprises a connecting unit mounted at a portion which corresponds to said front end portion of said memory card inserted therein, and said connecting unit comprises a plurality of pin terminals to be connected to said plurality of receptacles;

said device further comprises a printed circuit board mounted at a portions near said connecting unit, said printed circuit board comprising circuit patterns formed on upper and lower surfaces thereof; and said plurality of pin terminals are divided into upper and lower terminal groups, said upper terminal group being connected to said circuit patterns mounted on said upper surface of said printed circuit board, and said lower terminal group being connected to said circuit patterns mounted on said lower surface of said printed circuit board.

* * * * *